US012727317B2

(12) United States Patent
Kim et al.

(10) Patent No.: US 12,727,317 B2
(45) Date of Patent: Sep. 1, 2026

(54) COLOR-TUNABLE ORGANIC LIGHT EMITTING DIODE BASED ON PHOTONIC CRYSTAL STRUCTURE

(71) Applicant: KOREA UNIVERSITY RESEARCH AND BUSINESS FOUNDATION, Seoul (KR)

(72) Inventors: Tae Geun Kim, Seongnam-si (KR); Il Gyu Jang, Hwaseong-si (KR); Nahyun Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 525 days.

(21) Appl. No.: 18/214,638

(22) Filed: Jun. 27, 2023

(65) Prior Publication Data

US 2023/0422540 A1 Dec. 28, 2023

(30) Foreign Application Priority Data

Apr. 27, 2022 (KR) ........................ 10-2022-0051941

(51) Int. Cl.
*H10K 50/125* (2023.01)
*H10K 50/80* (2023.01)
*H10K 71/10* (2023.01)
*H10K 102/00* (2023.01)

(52) U.S. Cl.
CPC ........... *H10K 50/125* (2023.02); *H10K 50/80* (2023.02); *H10K 71/10* (2023.02); *H10K 2102/311* (2023.02)

(58) Field of Classification Search
CPC ............................ H10K 50/125; H10K 50/80
USPC ................................................. 313/498–512
See application file for complete search history.

(56) References Cited

U.S. PATENT DOCUMENTS

| | | | | |
|---|---|---|---|---|
| 2018/0041011 A1* | 2/2018 | Park | ........................ | H01S 5/041 |
| 2025/0169274 A1* | 5/2025 | Magno | .................. | C09K 19/40 |

FOREIGN PATENT DOCUMENTS

| | | |
|---|---|---|
| KR | 10-2005-0052648 A | 6/2005 |
| KR | 10-2018-0015354 A | 2/2018 |
| KR | 10-1845615 B1 | 4/2018 |
| KR | 10-1913027 B1 | 10/2018 |
| KR | 10-2019-0076832 A | 7/2019 |
| KR | 10-2055498 B1 | 12/2019 |
| KR | 10-2020-0083047 A | 7/2020 |
| KR | 10-2021-0131596 A | 11/2021 |

* cited by examiner

*Primary Examiner* — Christopher M Raabe
(74) *Attorney, Agent, or Firm* — NSIP Law

(57) ABSTRACT

Disclosed is a color tunable organic light emitting diode based on a photonic crystal structure. The color tunable organic light emitting diode includes at least one substrate, an anode and a cathode provided on the substrate, a photonic crystal layer provided between the anode and the cathode, and at least one emission layer provided on the photonic crystal layer, wherein a plurality of patterns are formed by a plurality of photonic crystals included in the photonic crystal layer, the photonic crystal layer is configured to be stretchable by a strain applied to the photonic crystal layer in a diagonal direction, and the at least one emission layer is configured to emit light of a specific color according to the plurality of patterns deformed by the strain.

10 Claims, 8 Drawing Sheets

COLOR TUNABLE ORGANIC LIGHT EMITTING DEVICE 310
COLOR TUNABLE ORGANIC LIGHT EMITTING UNIT
STRAIN APPLICATION UNIT
CONTROL UNIT
INFORMATION PROCESSING SYSTEM
312
314
316
320
300

COLOR-TUNABLE ORGANIC LIGHT EMITTING DIODE BASED ON PHOTONIC CRYSTAL STRUCTURE

STATEMENT REGARDING GOVERNMENT SPONSORED RESEARCH OR DEVELOPMENT

The concept of the present disclosure was derived from research conducted as part of the National Research Foundation's individual basic research (Ministry of Science and ICT) (R&D) (Task identification number: 1711112266, Assignment number: 2016R1A3B1908249, Research title: Research on high-efficiency photoelectric devices based on glass transparent electrodes, Research period: Mar. 1, 2022~Feb. 28, 2023, Contribution rate: 1/1).

CROSS REFERENCE TO RELATED APPLICATIONS

This application claims the benefit under 35 USC 119 (a) of Korean Patent Application No. 10-2022-0051941, filed with the Korean Intellectual Property Office on Apr. 27, 2022, the disclosure of which is incorporated herein by reference in its entirety.

TECHNICAL FIELD

Embodiments of the present disclosure described herein relate to a method for color variation according to a change in mechanical properties of an organic light emitting diode device having a photonic crystal (PC) structure, and more particularly, relate to a photonic crystal structure-based color tunable organic light emitting diode having a color tunable property that is not limited to the type and characteristics of an organic material stacked on a diode by inducing a change in the size of the pattern due to a change in physical properties of a photonic crystal layer.

BACKGROUND

There is no property interest of the Korean government in any aspect of the present disclosure.

An organic light emitting diode having an organic material layer between an anode and a cathode emits light due to recombination in an emission layer through the movement of carriers according to the current passed over, and emits light in the visible light range according to the properties of the organic material used and the thickness condition. The organic light emitting diodes (OLEDs) are in the limelight as a next generation display to replace conventional LCD displays due to their superiority in fast operation speed due to self-emission, high color purity and contrast ratio, low power operation, thinner and more flexible mechanical properties, and the like.

However, according to the related art, a conventional scheme of changing a color according to changes in voltage and current requires a high voltage, so that energy efficiency is low and there are limitations in selecting materials used for manufacturing diodes. In addition, in a scheme of adjusting the thickness of each layer of a diode, it is necessary to change the diode process conditions for each color in order to change the thickness of a device.

SUMMARY

According to an embodiment, a color tunable organic light emitting diode based on a photonic crystal structure includes at least one substrate, an anode and a cathode provided on the substrate, a photonic crystal layer provided between the anode and the cathode, and at least one emission layer provided on the photonic crystal layer, wherein a plurality of patterns are formed by a plurality of photonic crystals included in the photonic crystal layer, the photonic crystal layer is configured to be stretchable by a strain applied to the photonic crystal layer in a diagonal direction, and the at least one emission layer is configured to emit light of a specific color according to the plurality of patterns deformed by the strain.

According to an embodiment, the color tunable organic light emitting diode may further include a strain application unit configured to apply the strain to the photonic crystal layer; and a control unit to control an operation of the strain application unit such that at least one of a strength and a direction of the strain is adjusted.

According to an embodiment, the control unit may determine at least one of the strength or direction of the strain based on a target wavelength band, and the strain application unit may stretch the photonic crystal layer in a diagonal direction according to at least one of the determined strength or direction.

According to an embodiment, the specific color may be determined based on a distance between the plurality of patterns determined by the strain.

According to an embodiment, the specific color may be determined based on a diagonal direction length of each of the plurality of patterns determined by the strain.

According to an embodiment, the plurality of patterns may be adjusted in units of nanometer (nm) by the strain.

According to an embodiment, at least some of the plurality of patterns may include a mesh pattern.

According to an embodiment, the photonic crystal layer may be provided such that a distance between the plurality of patterns has a predetermined distance by using an E-beam lithography mask.

According to an embodiment, the anode and the cathode may be configured to be stretchable by the strain.

According to an embodiment, a method of manufacturing a color tunable organic light emitting diode based on a photonic crystal structure includes forming an anode over at least one substrate, forming a photonic crystal layer including a plurality of photonic crystals over the anode, forming at least one emission layer over the photonic crystal layer, forming a cathode over the at least one emission layer, wherein a plurality of patterns are formed by the plurality of photonic crystals included in the photonic crystal layer, the photonic crystal layer is configured to be stretchable by a strain applied to the photonic crystal layer in a diagonal direction, and the at least one emission layer is configured to emit light of a specific color according to the plurality of patterns deformed by the strain.

According to the embodiments, it is possible to provide a color tunable organic light emitting diode that overcomes the material and physical limitations of existing diodes by applying a photonic crystal-based flexible device structure.

According to the embodiments, by adding flexibility to the configuration of a diode, it is easy to change the distance difference between patterns, and the color tunable organic light emitting diode may be manufactured without changing a process design, thereby reducing the hardware design cost of the diode.

According to the embodiments, it is possible to provide a color tunable organic light emitting diode capable of inferring the distance between the patterns corresponding to colors of light emitted from the diode through simulation, and being precisely manipulated by adjusting the strain to change the distance in units of nanometer (nm) by using a systemized characteristic analysis device based on simulation results.

According to the embodiments, unlike conventional color variable devices, it is possible to provide a color tunable organic light emitting diode in which a material for an organic layer can be freely selected and power efficiency is improved.

According to the embodiments, because a color tunable organic light emitting diode having various specifications can be manufactured by widening the selection range of organic materials included in the diode, it is possible to provide a color tunable organic light emitting diode having high commercial utility value.

DETAILED DESCRIPTION

Figure 1:
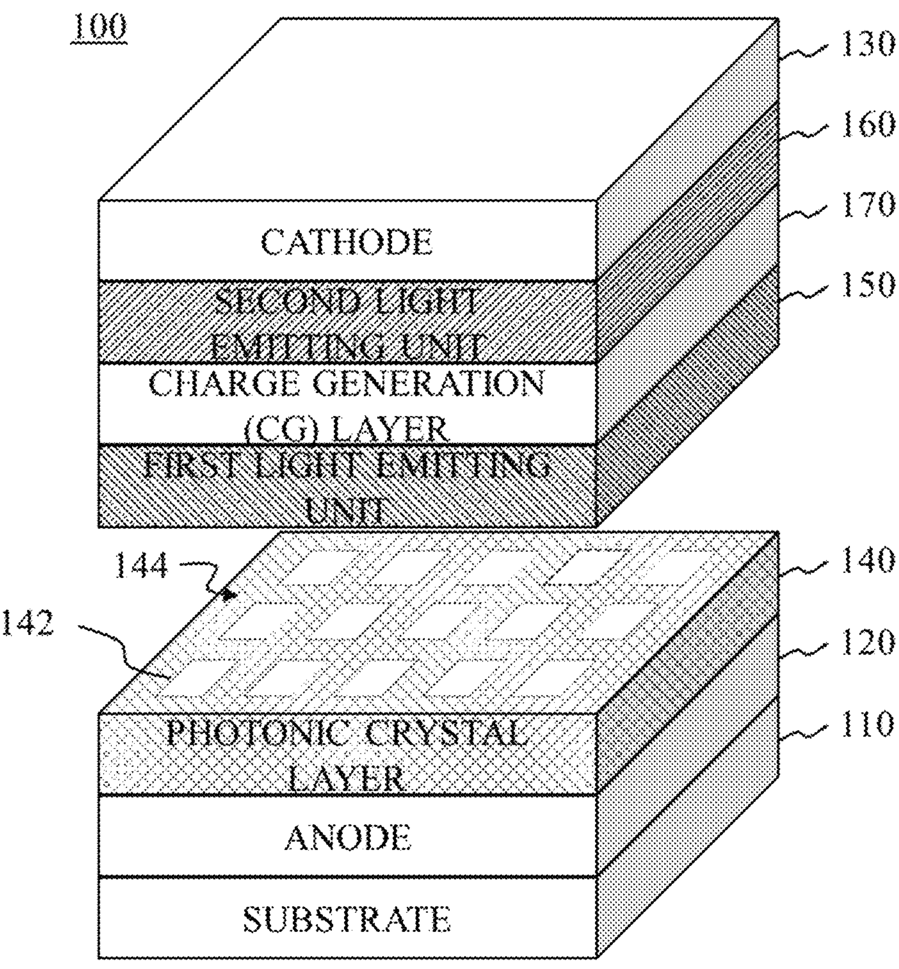
FIG. 1 is a schematic diagram illustrating a color tunable organic light emitting diode according to an embodiment of the present disclosure.

Hereinafter, embodiments of the present disclosure will be described in detail with reference to the accompanying drawings. In addition, a detailed description of well-known features or functions will be ruled out in order not to unnecessarily obscure the gist of the present disclosure.

In the accompanying drawings, the same or corresponding components will be assigned with the same reference numeral. In addition, in the description of the following embodiments, overlapping descriptions of the same or corresponding components may be omitted. However, omission of a description of a component does not intend that such a component is not included in an embodiment.

Advantages and features of embodiments of the present disclosure, and method for achieving thereof will be apparent with reference to the accompanying drawings and detailed description that follows. But it should be understood that the present disclosure is not limited to the following embodiments and may be embodied in different ways, and that the embodiments are given to provide complete disclosure and to provide thorough understanding of the present disclosure to those skilled in the art.

The terms used herein will be briefly described, and the disclosed embodiments will be described in detail. With respect to the terms used in an embodiment of the present disclosure, general terms currently and widely used are selected in view of function with respect to the disclosure. However, the terms may vary according to an intention of a technician practicing in the pertinent art, an advent of new technology, etc. In specific cases, terms may be chosen arbitrarily, and in this case, definitions thereof will be described in the description of the corresponding disclosure. Accordingly, the terms used in the description should not necessarily be construed as simple names of the terms, but be defined based on meanings of the terms and overall contents of the present disclosure.

In the present disclosure, singular forms are intended to include plural forms unless the context clearly indicates otherwise. In addition, plural forms are intended to include singular forms unless the context clearly indicates otherwise. Throughout the specification, when some part 'includes' some elements, unless explicitly described to the contrary, it means that other elements may be further included but not excluded.

The term "unit", as used in the specification, refers to software or a hardware component, which performs functions. However, the term "unit" is not limited to software or hardware. The "unit" may be configured to be included in an addressable storage medium and to play one or more processors. Accordingly, as an example, the term "unit" includes components, such as software components, object-oriented software components, class components, and task structural components, processes, functions, attributes, procedures, subroutines, segments of a program code, drivers, firmware, microcode, circuit, data, database, data structures, tables, arrays, and variables. Functions provided in components and "unit" may be engaged by a smaller number of components and "unit" or "module", or may be divided into additional components and "unit".

According to an embodiment of the present disclosure, the "unit" may be implemented with a processor and a memory. The "processor" should be interpreted broadly to include a general-purpose processor, a central processing unit (CPU), a microprocessor, a digital signal processor (DSP), a controller, a microcontroller, a state machine, and the like. In some circumstances, the processor may refer to an application specific integrated circuit (ASIC), programmable logic device (PLD), field programmable gate array (FPGA), or the like. The processor may refer to a combination of processing devices, such as a combination of a DSP and a microprocessor, a combination of a plurality of microprocessors, a combination of one or more microprocessors in conjunction with a DSP core, or a combination of other configurations. In addition, the term 'memory' should be interpreted broadly to include any electronic component capable of storing electronic information. The term 'memory' may refer to various types of processor-readable media, such as random access memory (RAM), read-only memory (ROM), non-volatile random access memory (NVRAM), programmable read-only memory (PROM), erasable-programmable read-only memory (EPROM), electrically erasable PROM (EEPROM), flash memory, magnetic or optical data storage, registers, and the like. A memory is said to be in electronic communication with the processor when the processor can read information from and/or write information to the memory. The memory integrated with the processor is in electronic communication with the processor.

According to an embodiment of the present disclosure, the 'diagonal' direction, which is a relative concept, may be interpreted as being replaced with 'longitudinal', 'lateral', 'top', 'bottom', 'left', and 'right' directions, respectively. For example, a first diagonal direction and a second diagonal direction of a photonic crystal layer may be interpreted as the same as a longitudinal direction and a transverse direction, respectively. For another example, the first diagonal direction and the second diagonal direction of the photonic crystal layer may be interpreted as the same as a vertical direction and a horizontal direction, respectively. In addition to the above examples, the 'longitudinal', 'lateral', 'top', 'bottom', 'left', 'right', and 'diagonal' directions mentioned in the present disclosure may be used interchangeably based on the viewpoint of the observer observing an object.

FIG. 1 is a schematic diagram illustrating a color tunable organic light emitting diode 100 according to an embodiment of the present disclosure. As shown, the color tunable organic light emitting diode 100 (hereinafter referred to as 'diode') may include a substrate 110, an anode 120, a cathode 130, and a photonic crystal layer 140, at least one light emitting unit 150 or 160, and a charge generation (CG) layer 170. The diode 100 of the present disclosure may emit light of a specific color by changing the magnitude and/or direction of strain applied to the diode 100 while current flows. Based on such characteristics, the diode 100 may be used for PCs, TVs, mobile devices, lighting, and the like.

According to an embodiment, the substrate 110 may be deformed by a strain applied to the diode 100. Deformation in the present disclosure refers to changing the size and/or shape of an object. For example, deformation may refer to being stretched, or returning from a stretched state to a previous or existing state. Meanwhile, to this end, the substrate 110 may include a flexible element.

According to an embodiment, the anode 120 and/or the cathode 130 may be provided on the substrate 110. For example, the anode 120 and/or the cathode 130 may be formed on the substrate 110 by using at least one of schemes of a sputtering system, electron beam evaporation, thermal evaporation, or molecular beam epitaxy. In addition, the anode 120 and/or the cathode 130 may be deformed by strain applied to the diode 100. Meanwhile, to this end, the anode 120 and/or the cathode 130 may include a flexible element. For example, the anode 120 and/or the cathode 130 may include at least one of $WO_3$, ZnO, IZO, Ag or Al.

According to an embodiment, the photonic crystal layer 140 may be provided between the anode 120 and the cathode 130. In this case, the photonic crystal layer 140 may include a pattern 142 and a planarization layer 144 formed of a photonic crystal material. In this case, the photonic crystal material may refer to a material that has a structure that can utilize the optical properties of the material (in the present disclosure, the above-described 'structure' is referred to as 'pattern') or is made to have a corresponding structure. In addition, the photonic crystal material may be a material having a lattice period similar to a wavelength of light, and for example, may include $SiO_2$. Accordingly, because the photonic crystal material constitutes the pattern 142, the photonic crystal layer 140 may have a property of reflecting only light of a specific wavelength among incident light.

According to an embodiment, the pattern 142 may be provided using an E-beam lithography mask process. Accordingly, the pattern 142 may be formed as a mesh pattern. The pattern 142 formed in this manner may be observed from the perspective of the front surface of the diode 100.

According to an embodiment, the photonic crystal layer 140 may be deformed by a strain applied to the diode 100. To this end, the photonic crystal layer 140 may include a flexible element. For example, the photonic crystal layer 140 may include SiNx, $SiO_2$, or the like. Accordingly, when a strain is applied to the diode 100, the distance between two patterns included in the photonic crystal layer 140 may be increased or reduced. Alternatively, the area and/or diagonal length (indicated by 'l' (length) in the present disclosure) of an arbitrary pattern included in the photonic crystal layer 140 may be increased or reduced. The details will be described later with reference to FIG. 3. Meanwhile, the planarization layer 144, which is a layer provided in the remaining area of the photonic crystal layer 140 except for the pattern 142, may include, for example, SiNx-.

According to an embodiment, at least one light emitting unit 150 or 160 may include at least one of the first light emitting unit 150 configured to emit yellow light or a second light emitting unit 160 configured to emit blue light. FIG. 1 illustrates that the second light emitting unit 160 is provided over the first light emitting unit 150, but the embodiment is not limited thereto and the first light emitting unit 150 may be provided over the second light emitting unit 160. Further, the diode 100 may include a light emitting unit composed of a combination of at least one of light emitting units (not shown) configured to emit yellow light, blue light, red light, or green light.

According to an embodiment, at least one of the at least one light emitting unit 150 or 160 may be deformed by the strain applied to the diode 100. To this end, the light emitting unit 150 or 160 may include a flexible element. For example, the light emitting unit 150 or 160 may include at least one flexible element among $WO_3$, ZnO, IZO, Ag, or Al. In addition, the light emitting unit 150 or 160 may include an organic material. For example, the light emitting unit 150 or 160 may include at least one organic material of DMAC-DPS, mCP or DPPS.

According to an embodiment, the charge generation layer 170 may be positioned between the first light emitting unit 150 and the second light emitting unit 160. In this case, the charge generation layer 170 may also be referred to as an intermediate connector layer (ICL). The charge generation layer 170, which is a layer that supplies electrons and holes to the light emitting units 150 and 160, may control charge balance between adjacent layers (in this case, the first light emitting unit 150 and the second light emitting unit 160), thereby improving the light emitting efficiency of the diode 100. Meanwhile, the charge generation layer 170 may also include a flexible element and may be deformed by a strain applied to the diode 100.

Figure 2:
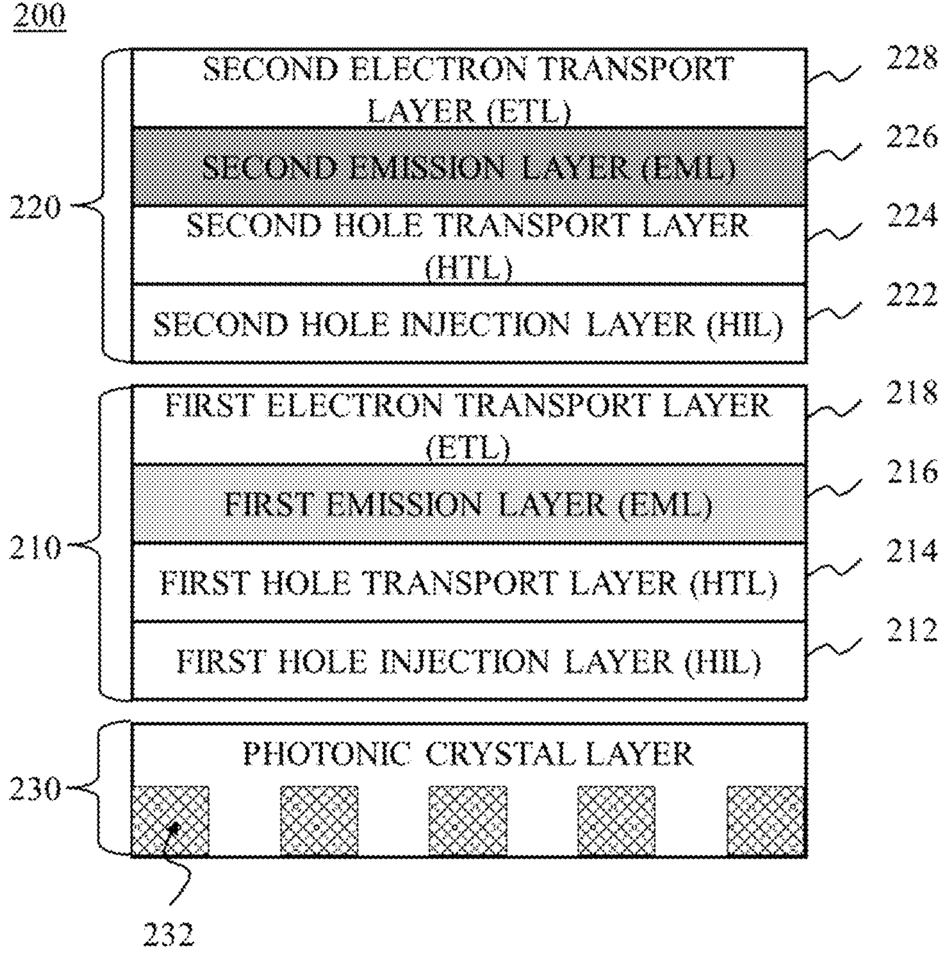
FIG. 2 is a cross-sectional view illustrating a tandem structure included in a diode according to an embodiment of the present disclosure.

FIG. 2 is a cross-sectional view illustrating a tandem structure 200 included in a diode (e.g., the diode 100) according to an embodiment of the present disclosure. In the present disclosure, a tandem structure may refer to a structure in which a plurality of light emitting units are coupled. In this case, a first light emitting unit 210 and a second light emitting unit 220 may correspond to the first light emitting unit 150 and the second light emitting unit 160 of FIG. 1, respectively. In addition, a photonic crystal layer 230 may correspond to the photonic crystal layer 140 of FIG. 1.

According to an embodiment, the first light emitting unit 210 may include at least one of a first hole injection layer (HIL) 212, a first hole transport layer (HTL) 214, a first emission layer (EML) 216, and a first electron transport layer (ETL) 218. Similarly, the second light emitting unit 220 may include at least one of a second hole injection layer 222, a second hole transport layer 224, a second emission layer 226, and a second electron transport layer 228. In this case, the hole injection layers 212 and 222 may refer to layers that facilitate injection of holes to be supplied to the emission layers 216 and 226. In addition, the hole transport layers 214 and 224 may refer to layers that move holes to the emission layers 216 and 226 such that holes injected into the anode are combined with electrons located in the emission layers 216 and 226. In addition, the electron transport layers

218 and 228 may refer to layers through which electrons move from a cathode (e.g., the cathode 130) to the emission layers 216 and 226.

According to an embodiment, the photonic crystal layer 230 may include a plurality of patterns. In this case, an arbitrary pattern 232 among a plurality of patterns may be provided using an E-beam lithography mask process. As shown in the tandem structure 200 of FIG. 2, the shape of the pattern 232 may be exposed when observing a cross section or front of a diode (e.g., the diode 100). For example, when the pattern 232 is formed as a mesh pattern, the mesh pattern of the pattern 232 may be exposed from a cross section or a front side of the diode.

Figure 3:
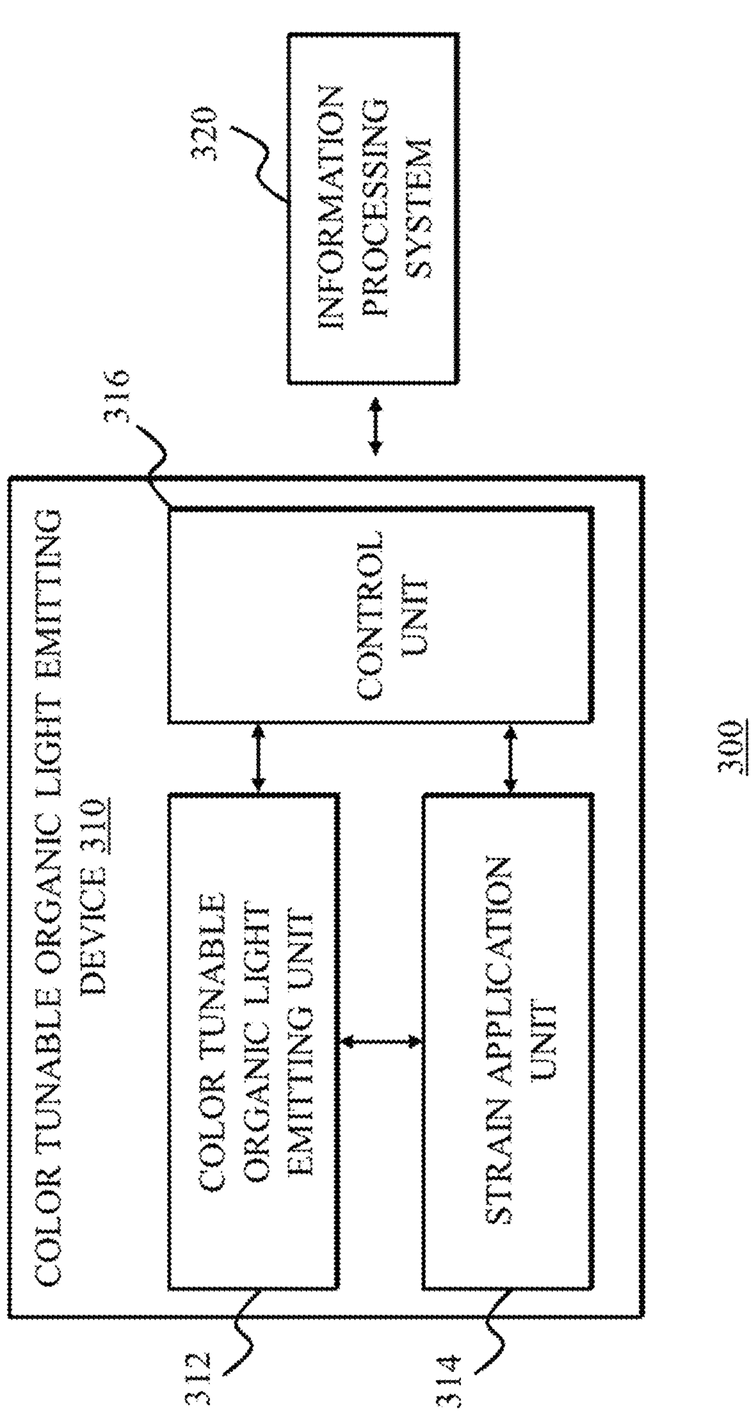
FIG. 3 is a block diagram illustrating a functional configuration of a color tunable organic light emitting device control system according to an embodiment of the present disclosure.

FIG. 3 is a block diagram illustrating a functional configuration of a color tunable organic light emitting device control system 300 (hereinafter, referred to as a ‘control system’) according to an embodiment of the present disclosure. As shown, the control system 300 may include a color tunable organic light emitting device 310 and an information processing system 320. In addition, the color tunable organic light emitting device 310 may include a color tunable organic light emitting unit 312, a strain application unit 314, and a control unit 316. In this case, the color tunable organic light emitting unit 312 may include the diode 100 of FIG. 1.

The information processing system 320 may include applications, programs, and the like for controlling manufacturing and/or operation of the color tunable organic light emitting device 310 through a network (not shown). According to an embodiment, the information processing system 320 may include a computer executable program (e.g., a downloadable application) related to manufacturing of a diode and controlling a strain applied to a diode. In addition, the information processing system 320 may include at least one server device and/or a database capable of storing, providing and executing data related to manufacturing of a diode and controlling a strain applied to a diode, or at least one distributed computing device based on cloud computing services and/or a distributed database.

A service related to the color tunable organic light emitting device 310 provided by the information processing system 320 may be provided to a user through a program or application installed in the color tunable organic light emitting device 310.

The color tunable organic light emitting device 310 may communicate with the information processing system 320 through a network. The network may be configured to enable communication between the color tunable organic light emitting device 310 and the information processing system 320. For example, depending on the construction environment, the network may be implemented as a wired network such as Ethernet, a wired home network (power line communication), a telephone line communication device, RS-serial communication, or the like, a wireless network such as a mobile communication network, a wireless LAN, Wi-Fi, Bluetooth, ZigBee, or the like, or a combination thereof. The communication scheme is not limited, and as well as a communication scheme utilizing a communication network (e.g., a mobile communication network, wired Internet, wireless Internet, a broadcasting network, a satellite network, and the like) capable of including the network, the short range wireless communication between the color tunable organic light emitting device 310 and the information processing system 320 may also be included.

FIG. 3 illustrates that one color tunable organic light emitting device 310 is connected to the information processing system 320, but the embodiment is not limited thereto. For example, a plurality of color tunable organic light emitting devices may be connected to the information processing system 320 through a network.

According to an embodiment, the information processing system 320 may receive information and/or data from the color tunable organic light emitting device 310. In this case, the information and/or data may include information and/or data (e.g., a thickness of each layer included in a diode, a distance between one pattern (e.g., the pattern 142) and another pattern, an area of a pattern, a length of a pattern, and the like) obtained by a sensor (e.g., a spectroradiometer) included in the color tunable organic light emitting device 310. In addition, the information and/or data may include data related to a lookup table and an algorithm used to control the color tunable organic light emitting device 310. For example, the information and/or data may include a lookup table in which the strength and/or direction of the applied strain and the color (or wavelength) of light emitted from the color tunable organic light emitting device 310 are matched. In addition, the information and/or data may include information about each layer (e.g., the layers 110, 120, 130, 140, 150, 160, and 170) included in the color tunable organic light emitting device 310 or physical properties (e.g., thickness, area, length, and the like) of components included in the corresponding layer.

According to an embodiment, the information processing system 320 may construct and update a database related to the color tunable organic light emitting device 310 based on the received information and/or data. In addition, the information processing system 320 may transmit a control signal generated based on the received information and/or data to the control unit 316 of the color tunable organic light emitting device 310. In this case, the control unit 316 may control all operations of the color tunable organic light emitting unit 312 and/or the strain application unit 314 based on the control signal.

According to an embodiment, the strain application unit 314 may apply a strain to the diode in a strength and direction within a certain range. In this case, a target strain value may be determined by the information processing system 320 or the control unit 316. In addition, the strain application unit 314 may apply a strain to the diode in a transverse direction (or horizontal direction), longitudinal direction (or vertical direction) or diagonal direction. In this case, the strength of the strain in each direction may be the same. Alternatively, the strength of the strain in each direction may be different. For example, the strength of the strain applied in the transverse direction may be different from the strength of the strain applied in the longitudinal direction. For another example, the strength of the strain applied in the first diagonal direction may be different from the strength of the strain applied in the second diagonal direction. Meanwhile, to this end, the strain application unit 314 may include an element in a jig. In this case, the element in the jig may be connected to the anode (e.g., the anode 120) and the cathode (e.g., the cathode 130) of the diode.

Figure 4A:
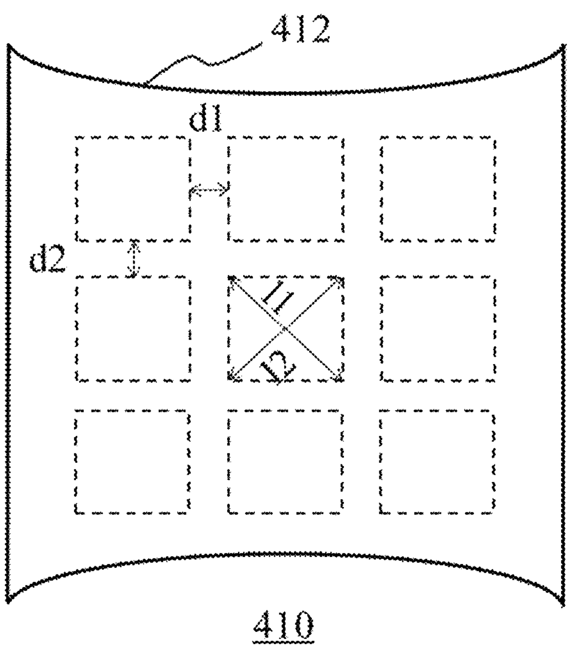
FIGS. 4A and 4B illustrate an example in which a strain is applied to a photonic crystal layer according to an embodiment of the present disclosure.
Figure 4B:
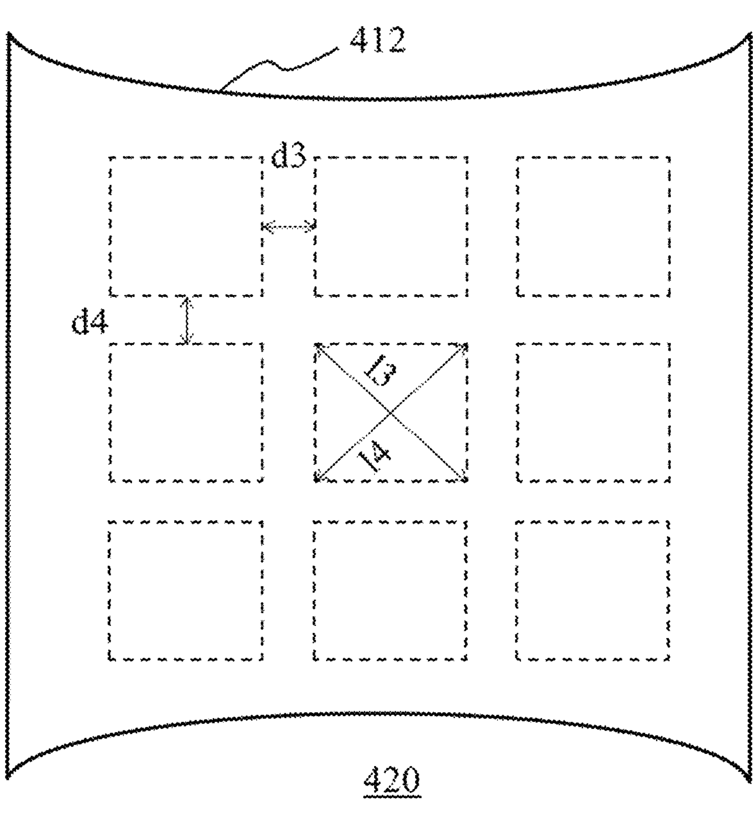

FIGS. 4A and 4B illustrate an example in which a strain is applied to a photonic crystal layer 412 according to an embodiment of the present disclosure. According to an embodiment, the photonic crystal layer 412 may be deformed through a first operation step 410 and a second operation step 420 while a strain is applied. In FIG. 4A, the first operation step 410 is an example in which a strain is applied to the photonic crystal layer 412 with a first strength in a first direction. As shown, in the photonic crystal layer 412, the distances between the plurality of patterns may be determined as d1 and d2 by the first strength of the strain applied in the first direction. In addition, the diagonal lengths of a pattern may be determined by l1 and l2. Meanwhile, the distance between the plurality of patterns and the diagonal length of the pattern may be adjusted in units of nanometers (nm).

After the first operation step 410, a strain of a second strength may be applied to the photonic crystal layer 412 in a second direction. In this case, the second strength may have a greater value than the first strength. In addition, the second strength may be equal to or smaller than a predetermined target strength according to a system (e.g., the control system 300). Likewise, the second direction may be the same as or different from the first direction. In addition, the second direction may be the same as a predetermined target direction according to the system. Referring to FIG. 4B, in the second operation step 420, in the photonic crystal layer 514, the distances between the plurality of patterns may be determined as d3 and d4 by the strain of the second strength applied in the second direction. In addition, the diagonal lengths of the pattern may be determined by 13 and 14. Due to such a configuration, the photonic crystal layer 412 may reflect light of a wavelength different from that before the strain is applied. That is, because the need to change conditions or variables or add operations in a convention process for manufacturing a diode (e.g., the diode 100) emitting light in a plurality of colors is eliminated, not only the complexity of the process may be significantly reduced, but also the process cost may be reduced. In addition, due to the above-described effects, it is possible to improve hardware design efficiency of various applications using diodes. Meanwhile, although a process of increasing the strength of the strain is illustrated in FIGS. 4A and 4B, a process of reducing the strength of the strain may also be implemented. In this case, the first operation 410 may be performed after the second operation 420.

Figure 5A:
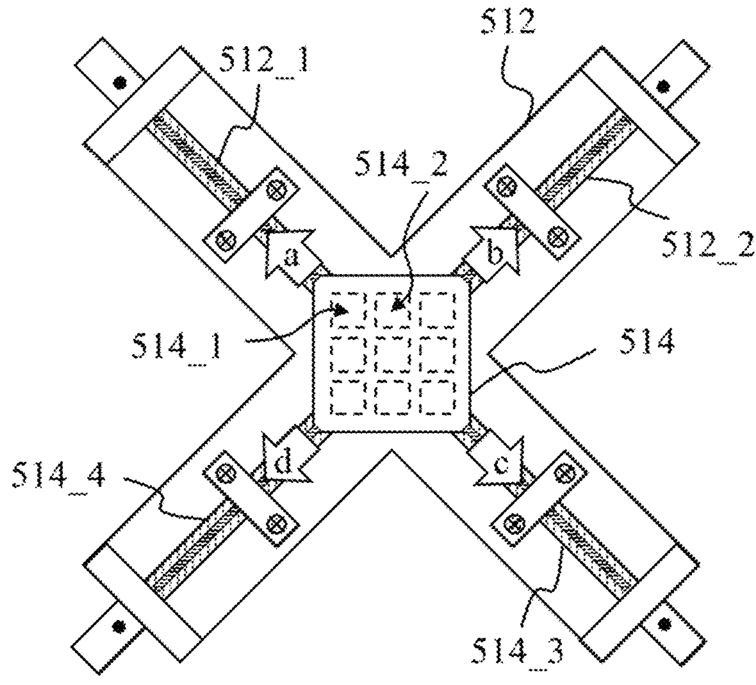
FIGS. 5A and 5B illustrate an example of a strain application unit according to an embodiment of the present disclosure.
Figure 5B:
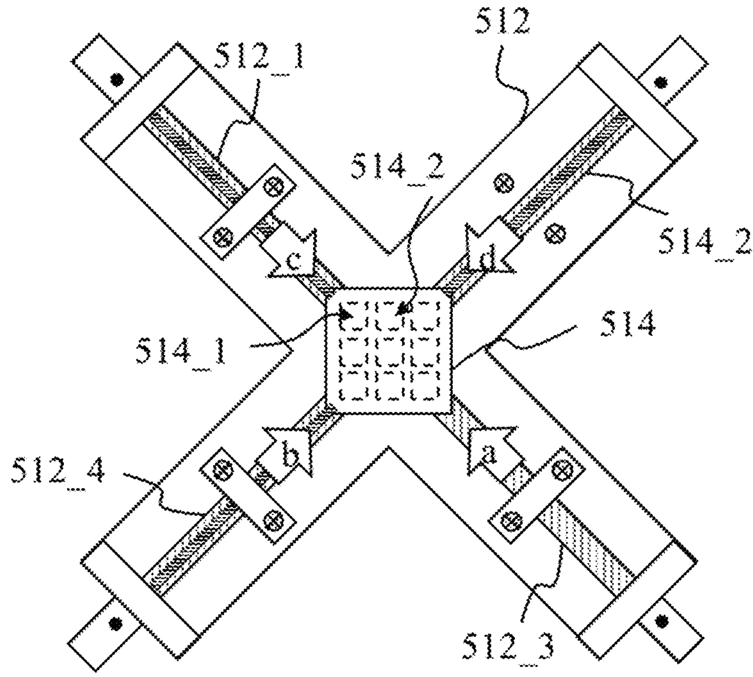

FIGS. 5A and 5B illustrate an example of a strain application unit 512 according to an embodiment of the present disclosure. In this case, the strain application unit 512 may correspond to the strain application unit 314 of FIG. 3. Accordingly, a control unit (e.g., the control unit 316) may determine at least one of the strength or direction of a strain based on a target wavelength band (i.e., the wavelength band of light of a specific color to be emitted), and the strain application unit 512 may stretch a photonic crystal layer 514 according to at least one of the determined strength or direction of the strain.

Additionally or alternatively, the strain application unit 512 may be used to generate a lookup table through simulation that measures the distance between patterns 514_1 and 514_2, a length of each of the patterns 514_1 and 514_2 in a diagonal direction, a wavelength band of light emitted by the photonic crystal layer 514, and the like according to the strength and/or direction of the strain applied to the photonic crystal layer 514.

Referring to FIGS. 5A and 5B, the strain application unit 512 may include driving units 512_1 to 512_4 configured to apply a strain in a scheme of fixing the photonic crystal layer 514 to be pulled in diagonal directions a, b, c and d. In this case, the driving units 512_1 to 512_4 including four separate members are illustrated, but the embodiments are not limited thereto. For example, the driving units 512_1 to 512_4 may be composed of a single member. As another example, the first driving unit 512_1 and the third driving unit 514_3 may be composed of one member, and the second driving unit 512_2 and the fourth driving unit 514_4 may be composed of another member.

In FIG. 5A, the first operation step 510 illustrates an example in which a strain is applied to the photonic crystal layer 514 in the diagonal directions a, b, c and d by the driving units 512_1 to 512_4. In detail, the first driver 512_1 may apply a strain in the first diagonal direction a, the second driver 512_2 may apply a strain in the second diagonal direction b, the third driver 512_3 may apply a strain in the third diagonal direction c, and the fourth driving unit 512_4 may apply a strain in the fourth diagonal direction d. Accordingly, the distance between the arbitrary first pattern 514_1 and the arbitrary second pattern 514_2 included in the photonic crystal layer 514 may increase in units of nanometer. In addition, the lengths of the first pattern 514_1 and the second pattern 514_2 in the diagonal directions a, b, c and d may be increased as described in FIGS. 4A and 4B.

According to an embodiment, the strengths of the strains in each diagonal direction a, b, c and d may be the same. In addition, the strength of the strain may be changed to adjust the distance between the arbitrary first pattern 514_1 and the arbitrary second pattern 514_2 included in the photonic crystal layer 514 in units of nanometer.

FIG. 5B illustrates an example in which the strain applied by the driving units 512_1 to 512_4 in a first operation step 510 is released in a second operation step 520. As shown, as the strain is released, the distance between the first pattern 514_1 and the second pattern 514_2 may decrease. In addition, the lengths of the first pattern 514_1 and the second pattern 514_2 in diagonal directions a, b, c and d may decrease.

Meanwhile, although an example in which the strain application unit 512 applies a strain to the photonic crystal layer 514 is illustrated in FIGS. 5A and 5B, the embodiment is not limited thereto, and the strain application unit 512 may apply a strain to a diode (e.g., the diode 100) of the present disclosure in the same/similar manner to the above-described manner. In addition, FIGS. 5A and 5B illustrate an example in which a strain is applied to the photonic crystal layer 514 in the first operation step 510 and then the strain is released in the second operation step 520, but to the contrary, the strain may be applied to the photonic crystal layer 514 again after the strain is released.

Figure 6:
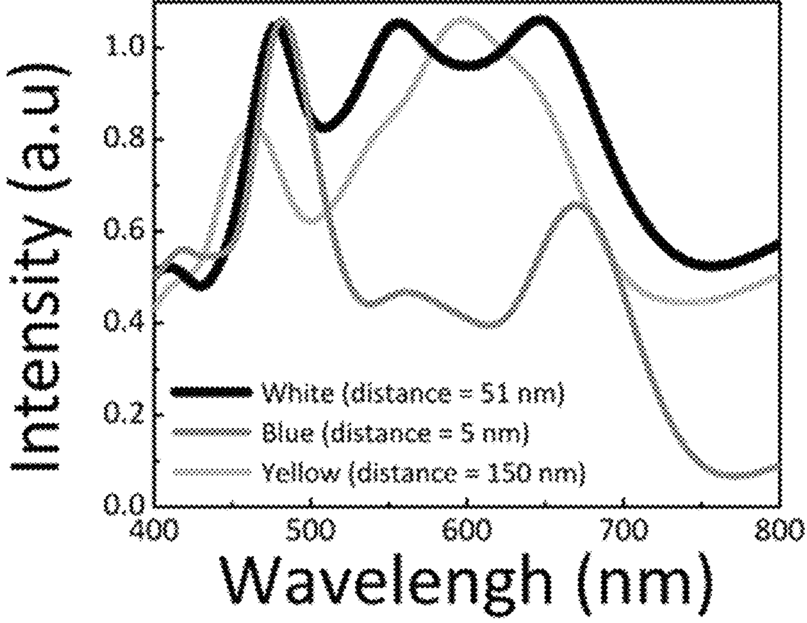
FIG. 6 is a diagram illustrating a result of simulating the emission wavelength of a diode according to an embodiment of the present disclosure.

FIG. 6 is a diagram illustrating a result of simulating the emission wavelength of a diode (e.g., the diode 100) according to an embodiment of the present disclosure. As described above, the wavelength band of light emitted by the diode may be determined according to the distance between the plurality of patterns and the diagonal length of each pattern changed by the strain applied to the diode. In an experiment related to the present disclosure, the distance between a plurality of patterns and the diagonal length of each pattern are calculated through 3D simulation, and in FIG. 6, a wavelength band spectrum according to a distance between a plurality of patterns is illustrated.

Referring to FIG. 6, when the distances between the plurality of patterns are 51 nm, 5 nm and 150 nm, it may be confirmed that the diode emits white, blue and yellow light, respectively. It may be confirmed that the distance between the patterns increases and accordingly, the strength of the wavelength band of the emitted light increases as the strength of the applied strain increases.

The preceding description of the present disclosure is provided to enable those having ordinary skill in the art to make or use the present disclosure. Various modifications of the present disclosure will be readily apparent to those skilled in the art, and the general principles defined herein may be applied in various modifications without departing from the spirit or scope of the present disclosure. Thus, the present disclosure is not intended to be limited to the examples set forth herein but is to be accorded the widest scope consistent with the principles and novel features disclosed herein.

Although exemplary implementations may refer to utilizing aspects of the disclosed subject matter in the context of one or more stand-alone computer systems, the subject matter is not so limited, but rather may be implemented in conjunction with a computing environment such as a network or a distributed computing environment. Further, aspects of the disclosed subject matter may be implemented with or as a plurality of processing chips or devices, and storage may be similarly affected by a plurality of devices. Such devices may include PCs, network servers, and handheld devices.

While the present disclosure has been described with reference to embodiments thereof, it will be apparent to those of ordinary skill in the art that various changes and modifications may be made thereto without departing from the spirit and scope of the present disclosure as set forth in the following claims. Moreover, such modifications and variations are intended to fall within the scope of the claims appended hereto.

What is claimed is:

1. A color tunable organic light emitting diode based on a photonic crystal structure, the color tunable organic light emitting diode comprising:

at least one substrate;

an anode and a cathode provided on the substrate;

a photonic crystal layer provided between the anode and the cathode; and at least one emission layer provided on the photonic crystal layer, wherein a plurality of patterns are formed by a plurality of photonic crystals included in the photonic crystal layer, the photonic crystal layer is configured to be stretchable by a strain applied to the photonic crystal layer in a diagonal direction, and the at least one emission layer is configured to emit light of a specific color according to the plurality of patterns deformed by the strain.

2. The color tunable organic light emitting diode of claim 1, further comprising:

a strain application unit configured to apply the strain to the photonic crystal layer; and a control unit configured to control an operation of the strain application unit such that at least one of a strength and a direction of the strain is adjusted.

3. The color tunable organic light emitting diode of claim 2, wherein the control unit is configured to determine at least one of the strength or direction of the strain based on a target wavelength band, and the strain application unit is configured to stretch the photonic crystal layer in the diagonal direction according to at least one of the determined strength or direction.

4. The color tunable organic light emitting diode of claim 1, wherein the specific color is determined based on a distance between the plurality of patterns determined by the strain.

5. The color tunable organic light emitting diode of claim 1, wherein the specific color is determined based on a diagonal direction length of each of the plurality of patterns determined by the strain.

6. The color tunable organic light emitting diode of claim 1, wherein the plurality of patterns are adjusted in units of nanometer (nm) by the strain.

7. The color tunable organic light emitting diode of claim 1, wherein at least some of the plurality of patterns include a mesh pattern.

8. The color tunable organic light emitting diode of claim 1, wherein the photonic crystal layer is provided such that a distance between the plurality of patterns has a predetermined distance by using an E-beam lithography mask.

9. The color tunable organic light emitting diode of claim 1, wherein the anode and the cathode are configured to be stretchable by the strain.

10. A method of manufacturing a color tunable organic light emitting diode based on a photonic crystal structure, the method comprising:

forming an anode over at least one substrate;

forming a photonic crystal layer including a plurality of photonic crystals over the anode;

forming at least one emission layer over the photonic crystal layer;

forming a cathode over the at least one emission layer, wherein a plurality of patterns are formed by the plurality of photonic crystals included in the photonic crystal layer, the photonic crystal layer is configured to be stretchable by a strain applied to the photonic crystal layer in a diagonal direction, and the at least one emission layer is configured to emit light of a specific color according to the plurality of patterns deformed by the strain.

* * * * *